United States Patent [19]
Kim et al.

[11] Patent Number: 5,916,858
[45] Date of Patent: Jun. 29, 1999

[54] LIQUID AND METHOD TO CLEAN METAL MASKS FOR SURFACE MOUNTING TECHNOLOGY

[75] Inventors: Choul-Su Kim; Woo-Sig Kim; Masaharu Tsukue, all of Suwon, Rep. of Korea

[73] Assignee: SamSung Electronics Co., Ltd., Suwon, Rep. of Korea

[21] Appl. No.: 08/864,119

[22] Filed: May 28, 1997

[30] Foreign Application Priority Data

Jul. 19, 1996 [KR] Rep. of Korea .................. 96 29277

[51] Int. Cl.$^6$ ................................ C11D 3/43; C23G 5/02
[52] U.S. Cl. .................. 510/175; 510/176; 510/407; 510/412; 510/413; 134/1.3; 134/26
[58] Field of Search ...................... 510/175, 176, 510/407, 412, 413, 414; 134/1.3, 34.2, 26, 38, 40, 42

[56] References Cited

U.S. PATENT DOCUMENTS

| | | | |
|---|---|---|---|
| 3,723,332 | 3/1973 | Barton | 252/171 |
| 4,018,689 | 4/1977 | Thompson | 252/8.55 C |
| 4,440,653 | 4/1984 | Briscoe et al. | 252/8.55 R |
| 4,606,842 | 8/1986 | Keyes et al. | 252/174.23 |
| 4,847,004 | 7/1989 | McLeod | 252/527 |
| 4,971,083 | 11/1990 | Stach et al. | 134/57 R |
| 5,011,713 | 4/1991 | Lenti et al. | 427/393.6 |
| 5,023,010 | 6/1991 | Merchant | 252/171 |
| 5,043,088 | 8/1991 | Falla | 252/70 |
| 5,238,504 | 8/1993 | Henry | 134/40 |
| 5,250,213 | 10/1993 | Rozen et al. | 252/162 |
| 5,271,775 | 12/1993 | Asano et al. | 134/40 |
| 5,271,861 | 12/1993 | Buchwald et al. | 252/153 |
| 5,302,313 | 4/1994 | Asano et al. | 252/171 |
| 5,456,760 | 10/1995 | Goehausen | 134/42 |
| 5,593,504 | 1/1997 | Cala et al. | 134/1 |

OTHER PUBLICATIONS

McCutcheon's, vol. 1: Emulsifiers & Detergents, North American Edition, p. 83, #–97.

Sharovarnikov, A.F., et al., "Surface activity of fluorine–containing surfactants in polar solvents and water–organic mixtures", Kolloidn. Zh., 53(5), 949–954, #–91.

Shah, Khalid M., et al., "Change your surfactant formula and use etch baths for a week", Semicond. Int., 11(11), 132–134, #–88.

Month not available.

*Primary Examiner*—Mark Kopec
*Assistant Examiner*—Gregory E. Webb
*Attorney, Agent, or Firm*—Robert E. Bushnell, Esq.

[57] ABSTRACT

A method for washing metal masks using a cleaning liquid includes the steps of washing the metal masks before a solder printing process on printed circuit boards, washing the metal masks at least once during the solder printing process and washing the metal masks after completing the last solder printing process. The washing liquid has a composition consisting of from 1 to 5% by weight of a fluorine-based surfactant and from 95 to 99% by weight of isopropyl alcohol, the some of the constituents being 100% by weight. More preferably, the cleaning liquid is a composition consisting of 2% by weight of the fluorine-based surfactant and 98% by weight of isopropyl alcohol, the some of the constituents being 100% by weight.

4 Claims, 4 Drawing Sheets

LIQUID AND METHOD TO CLEAN METAL MASKS FOR SURFACE MOUNTING TECHNOLOGY

This application makes reference to, incorporates the same herein, and claims all benefits accruing under 35 U.S.C. §119 from an application for LIQUID AND METHOD TO CLEAN METAL MASKS FOR SURFACE MOUNTING TECHNOLOGY earlier filed in the Korean Industrial Property Office on Jul. 19, 1996 and there duly assigned Serial No. 29277/1996.

BACKGROUND OF THE INVENTION

1. Field of the Invention

The present invention relates generally to a cleaning liquid and method to clean metal masks for improving print consecutiveness in surface mounting technology. More specifically, it relates to an improved cleaning liquid and method to wash metal masks where solder cream is applied to form patterns therethrough on the pads of printed circuit boards(PCBs), reducing the rate of poor PCBs and extending cleaning period for metal masks.

2. Description of the Related Art

In the solder printing process of the surface mounting technology, solder cream is applied to a metal mask having the same pattern holes as a predetermined circuit pattern to be printed on the pads of PCBs and the solder cream passes through the holes to form the predetermined circuit pattern on the pads of the PCBs. However, since the width of the holes are so minute, the holes are prone to be blocked up and this results in poor PCBs.

The two Asano et al. patents, U.S. Pat. Nos. 5,302,313 and 5,271,775, respectively entitled Halogenated Hydrocarbon Solvents, and Methods For Treating Substrates By Applying A Halogenated Hydrocarbon Thereto, each disclose a solvent composition consisting of a fluorine compound combined with an organic solvent which may be alcohol. The Buchwald et al. patent, U.S. Pat. No. 5,271,861, entitled Fluorochlorohydrocarbon-Free Cleaning Compositions, discloses a cleaning composition composed of alcohol or partially fluorinated alcohol and a surfactant. The Rozen et al. patent, U.S. Pat. No. 5,250,213, entitled 1,1,1,2,2,3,3,4,4,5,6-Undecafluorohexane And Use Thereof In Compositions And Processes For Cleaning, discloses the combination of a fluorine based compound combined with an alcohol. The Stach et al. patent, U.S. Pat. No. 4,971,083, entitled Apparatus And Method For Cleaning Solder Paste From Items Associated With Surface Mount Technology Manufacturing, discloses an apparatus for and a method of cleaning solder paste from items associated with surface mount technology manufacturing. Similarly, the Cala et al. patent, U.S. Pat. No. 5,593,504, entitled Method Of Cleaning Solder Pastes From A Substrate With An Aqueous Cleaner, discloses a method of cleaning solder paste from a substrate with an aqueous cleaner. The Barton patent, U.S. Pat. No. 3,723,332, entitled Stabilized Perchlorofluorocarbon Compositions, discloses a combination of a fluorine based compound and an alcohol for use as a cleaning liquid. The following additional patents each disclose features in common with the present invention but are not as pertinent as the patents discussed above. U.S. Pat. No. 5,456,760 to Goehausen, entitled Cleaning Process For Electronic And Electrical Assemblies, U.S. Pat. No. 5,238,504 to Henry, entitled Use Of Terpene Hydrocarbons And Ketone Blends For Electrical contact Cleaning, and U.S. Pat. No. 5,023,010 to Merchant, entitled Binary Azeotropic Compositions Of 1,1,1,2,3,3-Hexafluoro-3-Methoxypropane With Methanol Or Isopropanol Or N-Propanol.

We have found that to avoid the PCBs, the metal mask requires periodic washing steps. Typically, cleaning liquids that clean metal masks are 100% isopropyl alcohol (IPA). However, these cleaning liquids are excessively consumptive due to their high volatility and is not possible to completely remove solder residue from metal masks using 100% IPA cleaning liquids after the solder printing processes. The solder residue in the holes of the metal masks keeps the newly applied solder cream from smoothly passing through the holes. This could lead to poor PCBs having such defects as short circuits, insufficient circuits, lifted circuits, etc., particularly using these 100% IPA cleaning liquids, the above adverse results occur more frequently in the first process PCB just after washing the masks.

When the 100% IPA cleaning liquid is used for washing the metal masks, the solder penetration through the metal masks to the first process PCB is inferior to the subsequently processed PCBs. Only 50% of the holes in the metal masks are in good condition. As the solder printing process progresses, the rate of the poor PCBs decreases but after five or six solder printing processes, the rate of the poor PCBs again increases. In other words, using the previously used cleaning liquids causes a problem such as a high rate of poor PCBs and requires washing steps of the metal masks every five uses of the metal mask. Moreover, there is another problem due to uneven surfaces of the PCBs due to the solder residue after the solder printing process.

SUMMARY OF THE INVENTION

Accordingly it is an object of the invention to enhance print consecutiveness and provide even solder printed surfaces of PCBs without such defects as short circuits, insufficient circuits and lifted circuits by using the cleaning liquids of isopropyl alcohol and fluorine-based surfactant instead of the a pure IPA cleaning liquid, the mixed cleaning liquids exhibiting enhanced washing performance and extended washing period.

To achieve the above object, the present invention comprises by weight 95–99% IPA and 1–5% fluorine-based surfactant.

The method to clean metal masks using the cleaning liquid of the invention includes three washing steps. They are a pre-process washing step carried out before solder printing process, an in-process washing step carried out at least once during the solder printing process after producing a predetermined number of PCBs and a post-process washing step carried out after completing the last solder printing process for storage purposes.

The cleaning liquid of the invention may be used in three types of mixtures consisting of different proportions of IPA and fluorine-based surfactant for the above three steps respectively and may be also used in one type of mixture over the three steps.

The object, features and advantages of the present invention will be apparent from the following description of a preferred embodiment thereof and from the accompanying drawings.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
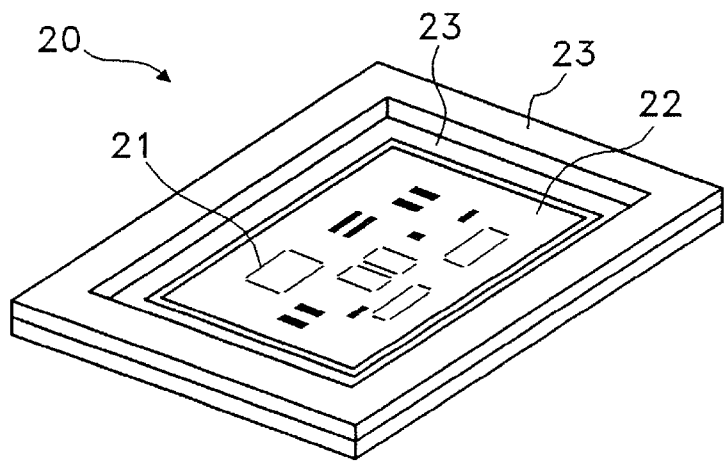
FIG. 1 shows a frame including a metal mask used in surface mounting technology.

FIG. 1 shows a frame including a metal mask used in surface mounting technology. The frame 20 consists of a metal mask 22 and a support means 23 to support the metal mask 22. In the metal mask 22, minute holes 21 are formed in a fixed patterns. When solder cream is applied to the metal mask 22, the solder cream passes through the holes 21 and forms the pattern on the pads of PCBs placed under the metal mask 22.

Figure 2:
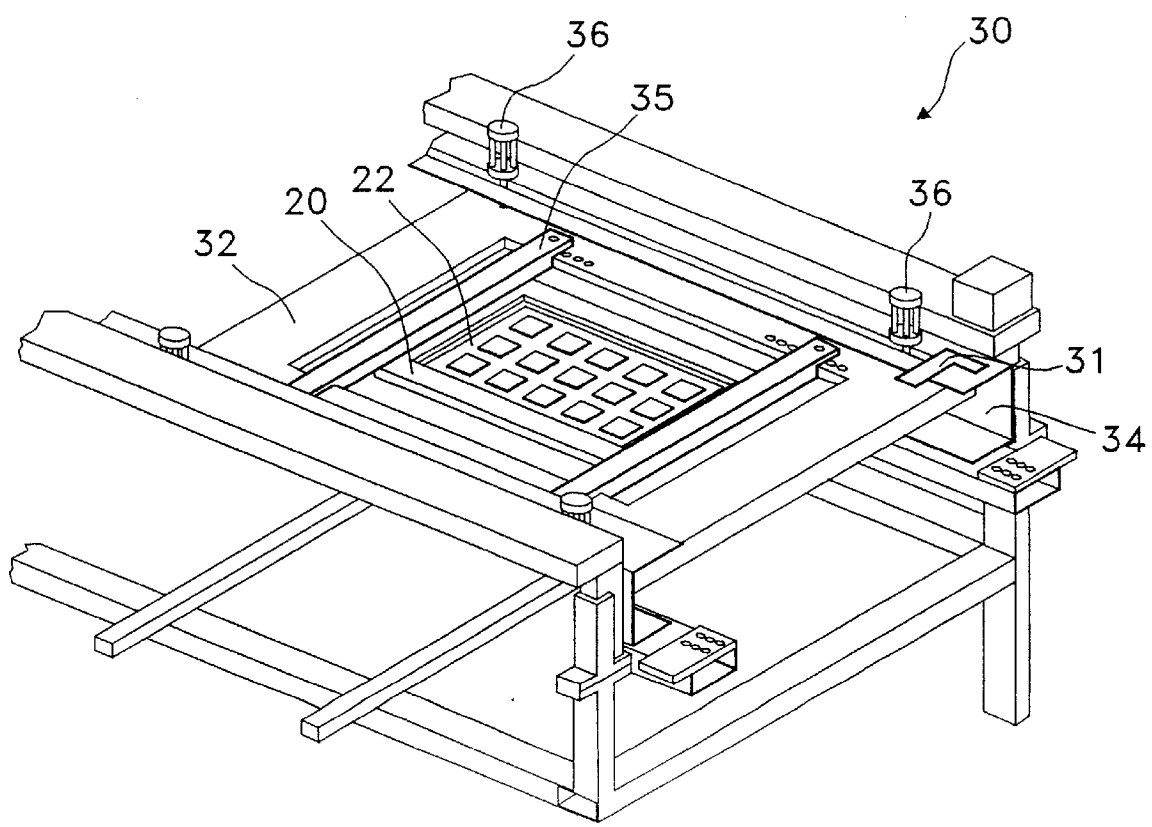
FIG. 2 is a perspective view showing the simplified structure of an automated surface mounting apparatus 30 where the frame 20 shown in FIG. 1 is positioned.

FIG. 2 is a perspective view showing the simplified structure of an automated surface mounting apparatus 30 where the frame 20 shown in FIG. 1 is positioned.

The automated surface mounting apparatus 30 includes a frame placing means 32 to place the frame 20, a guide rail 34 to guide the frame placing means 32 to be introduced into the apparatus 30, a roller 36 to move the frame placing means 32 horizontally and a frame holding means 31 to hold the frame placing means 32 in steady position over PCBs.

Figure 3:
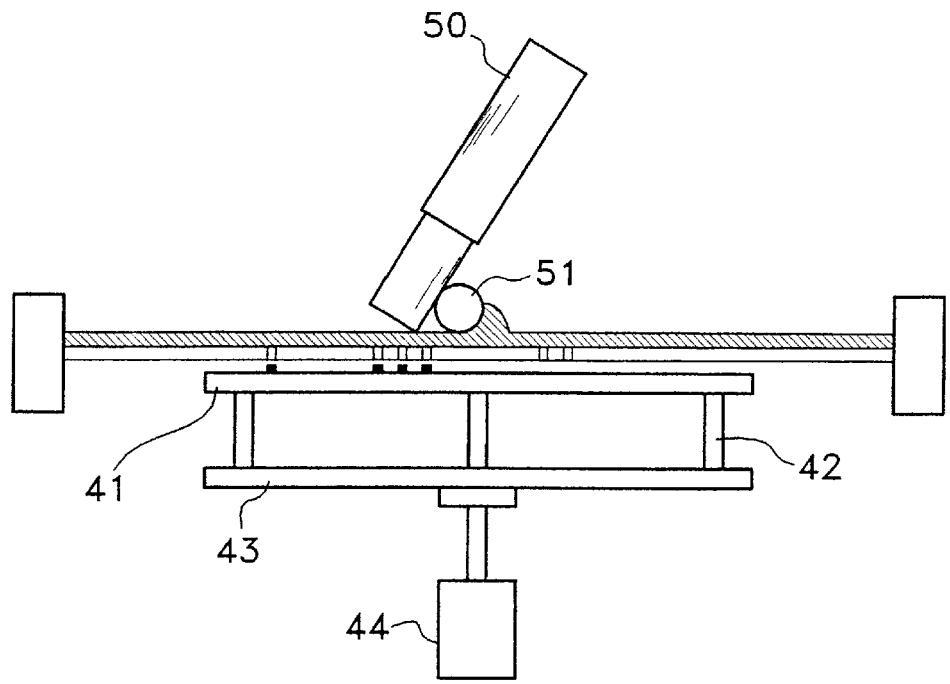
FIG. 3 is a schematic diagram showing the solder cream applying process on PCBs with a metal mask positioned.

FIG. 3 is a schematic diagram showing the solder cream applying process on PCBs with a metal mask positioned.

A PCB 41 is located under a frame 20 with the metal mask 22. Below the PCB 41 a base 43 is adapted to hold a support bar 42 for supporting the PCB 41. The base 43 moves up and down relative to the up and down motion of a cylinder rod of a base cylinder 44.

Above the metal mask 22 is a squeeze cylinder 50. A squeeze cylinder rod of the squeeze cylinder 50 is movable horizontally as well as vertically. In accordance with the horizontal movement of the squeeze cylinder rod, a roller 51 then rolls.

Figure 4:
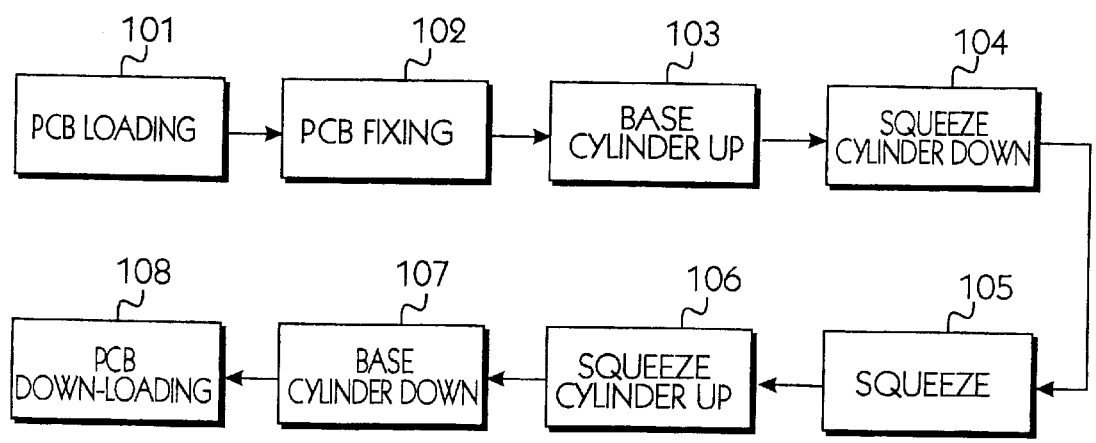
FIG. 4 is a flowchart showing the procedure of the solder printing process to PCBs.

FIG. 4 is a flowchart showing the procedure of solder printing process on PCBs.

This solder printing process begins with loading a PCB to be maintained by the support bar of the base 101 and fixing the PCB at a predetermined position under a metal mask 102. Then the rod of the base cylinder moves up and the PCB on the support bar comes into contact with the metal mask 103. Successively solder cream is applied on the metal mask, followed by moving down the squeeze cylinder 104. Then, pushing the roller with a fixed pressure the squeeze cylinder moves horizontally to allow the solder cream to be squeezed by the roller through the holes of the metal mask and form a predetermined pattern on the pad of the PCB 105. After this squeeze step the rod of the squeeze cylinder moves up 106 and the base cylinder moves down 107. The surface mounting process ends with loading down the PCB 108 in reverse order as the PCB is loaded.

In this surface mounting process including the steps of, applying the solder cream, squeezing the solder cream on the metal mask and forming predetermined patterns on PCBs with the solder cream passed through the hole patterns of the metal mask, the minute holes forming the patterns are prone to blockage during the squeeze step. This results in poor patterns on PCBs.

Therefore to avoid the poor patterns, the metal mask requires periodical washing steps. Typically, cleaning liquids that clean metal masks are 100% isopropyl alcohol (IPA). However, these cleaning liquids are excessively consumptive due to their high volatility and it is not easy to completely remove solder residue from metal masks using the 100% IPA cleaning liquids after the solder printing processes. The solder residue in the holes of the metal masks keeps the newly applied solder cream from smoothly passing through the holes. This can lead to poor PCBs having such defects as short circuits, insufficient circuits, lifted circuits, etc. Particularly, using these 100% IPA cleaning liquids, the above adverse results occur more frequently in the first processed PCB just after washing the masks.

Figure 5:
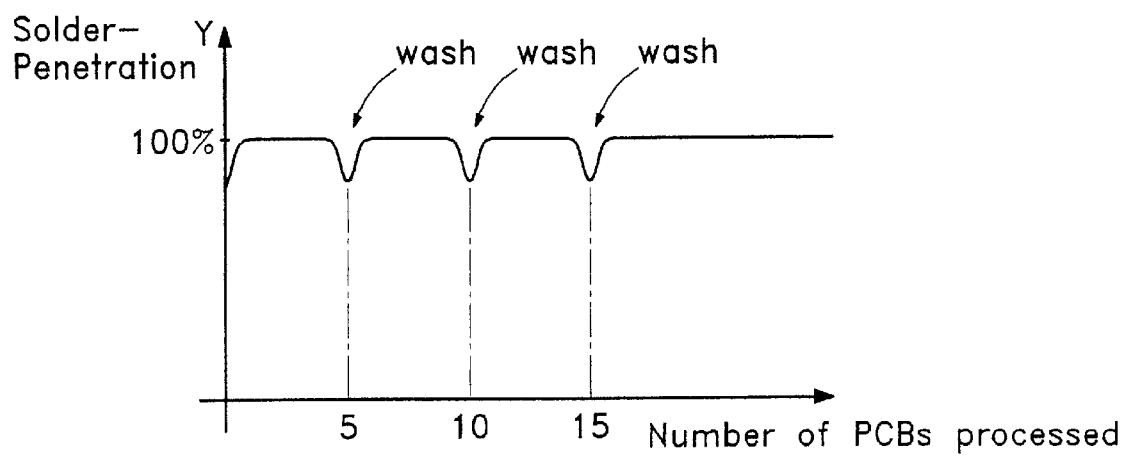
FIG. 5 is a graph showing the washing period and the yield when 100% IPA is used as a cleaning liquid.

FIG. 5 is a graph showing the washing period and the yield when 100% IPA is used for cleaning metal masks.

The horizontal shaft X represents the number of times using the metal mask and the vertical shaft Y represents the solder-penetration through the holes of the metal mask. In this graph the best solder-penetration state is seen as 100% and the worst state is seen as 0%. When the IPA cleaning liquid is used for washing the metal mask, the solder-penetration through the metal mask to the first processed PCB is inferior to the subsequently processed PCBs. Only 50% of the holes in the metal mask are in good condition. As the solder printing process progresses, the rate of the poor PCBs decreases but after 5 to 6 solder printing processes, the rate of the poor PCBs again increases. In other words, using the previously used cleaning liquids causes a problem such as high rate of poor PCBs and requires washing of the metal mask every 5 uses of the metal mask. Moreover, there is another problem due to the uneven surfaces of the PCBs due to the solder residue after the solder printing process.

A detailed description of the liquids according to the present invention and method for cleaning metal masks for use in surface mount technology using the same is as follows. The three cleaning liquids of the present invention are shown in Table 1 below.

TABLE 1

| Cleaning liquids | Proportion of composition |
| --- | --- |
| A | IPA: 95% |
|   | Fluorine-based surfactant: 5% |
| B | IPA: 96.5% |
|   | Fluorine-based surfactant: 3.5% |
| C | IPA: 98% |
|   | Fluorine-based surfactant: 2% |

TABLE 2

| Test No. | Cleaning liquids for washing metal masks | maximum number of PCBs which can be processed | Standard number of PCBs | Print consecutiveness of metal masks | solder penetration of metal masks | Uniformity of the solder printed surface of PCBs | Rate of poor PCBs | Ranking |
|---|---|---|---|---|---|---|---|---|
| 1 | Pre-process washing with cleaning liquid A In-process washing with cleaning liquid B Post-process washing with cleaning liquid C | 50 | 10 | GOOD | GOOD | GENERAL | GENERAL | 4 |
| 2 | Pre-process washing with cleaning liquid A In-process washing with cleaning liquid B Post-process washing with cleaning liquid C | 80 | 20 | GOOD | GOOD | GOOD | GENERAL | 2 |
| 3 | Pre-process washing with cleaning liquid A In-process washing with cleaning liquid B Post-process washing with cleaning liquid C | 60 | 15 | GENERAL | GOOD | GOOD | GENERAL | 3 |
| 4 | Pre-process washing with cleaning liquid A In-process washing with cleaning liquid B Post-process washing with cleaning liquid C | 125 | 25 | EXCELLENT | EXCELLENT | GOOD | EXCELLENT | 1 |

Pre-process washing step is a step for washing metal masks before beginning solder printing process, i.e., before firstly printing the PCR. In-process washing step is a step for washing metal masks at least once during the solder printing process. Postprocess washing step is a step for washing metal masks after completing the last solder printing process, i.e., a washing step for storage purposes. This is a distinguished feature of the present invention. There are four tests using the above three cleaning liquids shown in Table 1. The four tests are shown in Table 2 above. As shown in Table 2, the 4$^{th}$ test exhibits the best results among the four tests.

The Test 1 operated using the cleaning liquid A for the pre-process washing step, the cleaning liquid B for the in-process washing step and the cleaning liquid C for the post-process washing step is capable of maximally producing 50 PCBs between the in-process washing steps and is capable of producing 10 standard PCBs with the poor PCBs excluded. Print consecutiveness of a metal mask and solder-penetration through the metal mask are also better than using the 100% IPA cleaning liquid. However in the view of productive capability of evenly solder printed surface on PCBs and the rate of poor PCBs, the Test 1 has the same features with the earlier cleaning liquids.

In Test 2 the cleaning liquid A is used over the three washing steps. Test 2 is capable of maximally producing 80 PCBs and is capable of producing 20 standard PCBs with the poor PCBs excluded. As for print consecutiveness, solder-penetration through metal masks and productive capability of evenly soder printed surface on PCBs, Test 2 has better features than using the earlier cleaning liquids. The rate of poor PCBs in Test 2 is same as using the earlier cleaning liquids.

In Test 3 the cleaning liquid B is used for all the three steps. This embodiment is capable of maximally producing 60 PCBs and is capable of producing 15 standard PCBs. The print consecutiveness and the capacity preventing from poor PCBs are same as using the earlier cleaning liquids. The solder-penetration through metal masks and the characteristic to achieve evenly soldered surfaces of PCBs are better than using the earlier cleaning liquids.

In Test 4 the cleaning liquid C is used for all the three steps the maximum number of PCBs is up to 125, the standard number of PCBs up to 25. Furthermore in the view of the print consecutiveness, solder penetration through metal masks and the characteristic avoidable poor PCBs, this embodiment has much better features than using the earlier cleaning liquids. Productive capability of evenly soder printed surface on PCBs is also much better than using the earlier cleaning liquids.

Accordingly these embodiments show that using mixture cleaning liquids of IPA and fluorine-based surfactant is more effective than using the earlier cleaning liquids of IPA only. These embodiments further show that using a kind of mixture over the three steps is more effective than using different mixtures for each of the three steps. In particular, it is noted that the mixture of 98% IPA and 2% fluorine-based surfactant is preferable.

Figure 6:
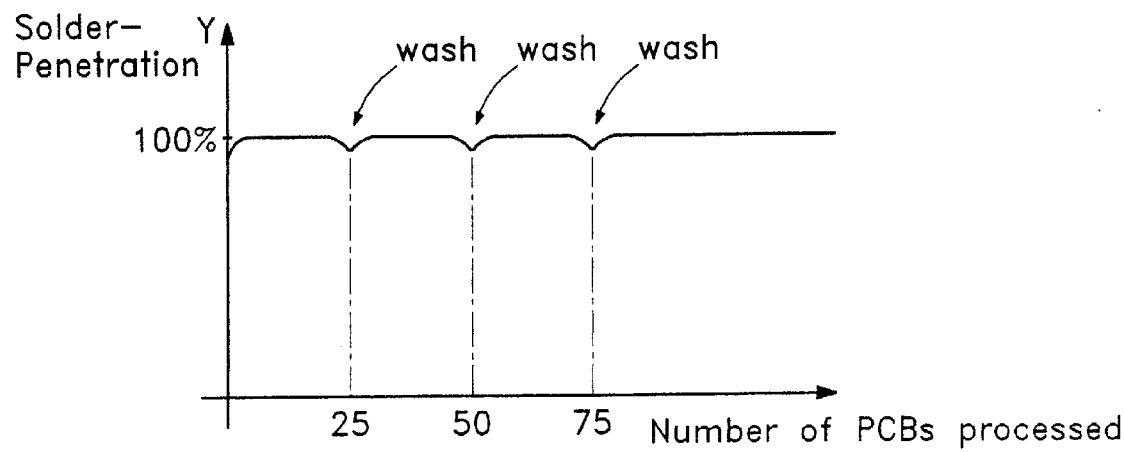
FIG. 6 is a graph showing the washing period and the yield when the cleaning liquid C is used as a cleaning liquid.

With reference to FIG. 6, the graph shows washing a effect when the cleaning liquid C is used for cleaning metal masks during solder printing process. Compared with FIG. 5, the rate of poor PCBs night after the washing step is reduced notably and the washing period is also extended remarkably, thereby the possible number of PCBs processed until the following washing step is increased to 25.

Figure 7:
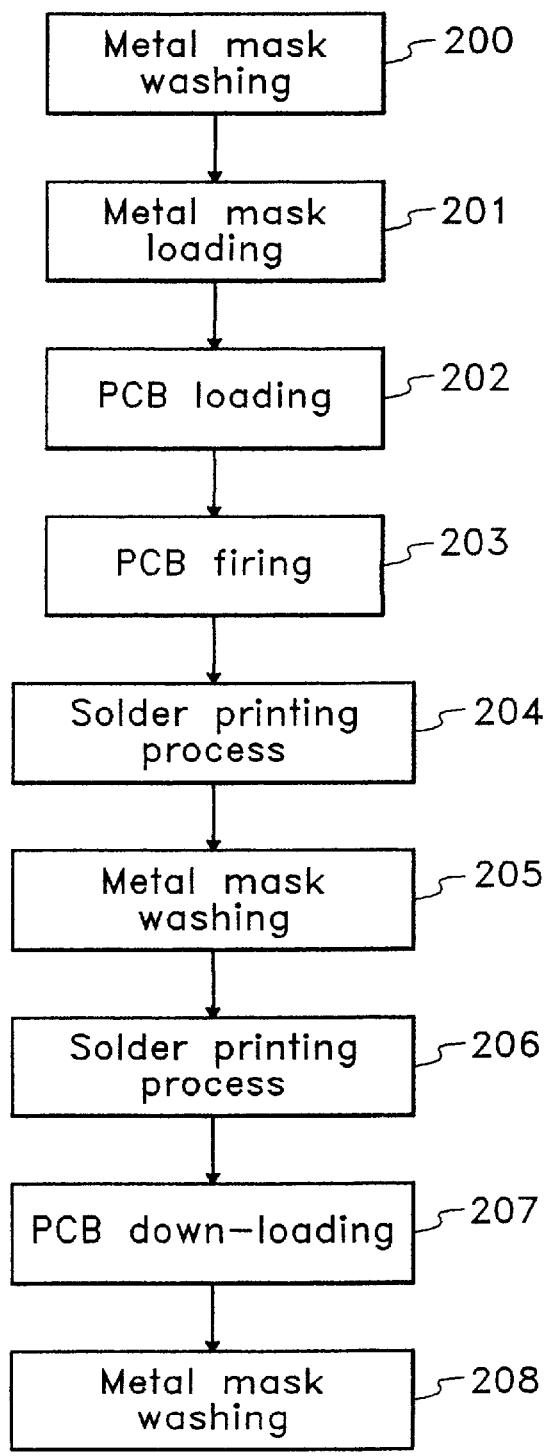
FIG. 7 is a flowchart showing the process of surface mounting technology when a mixture of IPA and fluorine-based surfactant is used for cleaning metal masks.

FIG. 7 is a flowchart showing the process of surface mounting technology when a mixture of IPA and fluorine-based surfactant is used for cleaning metal masks.

First metal masks are washed before the solder printing process, namely the pre-process washing step in this invention 200 and a frame with the metal mask is loaded on a surface mounting apparatus 201. Then a PCB is loaded 202 and the PCB is fixed at a predetermined position under the metal mask 203. Then the solder printing process is carried out a predetermined number of times 204. The metal mask is washed after the step 204, namely the in-process washing step in this invention 205. Then, the soldering process is carried out again a predetermined number of times 206. The steps 204, 205 and 206 may be operated repeatedly by appointed times. After completing the last solder printing process, the PCB is down loaded 207. Lastly for preserving the metal mask, it is washed again. This is the post-process washing step of the invention 208.

The present invention provides mixed cleaning liquids of IPA and fluorine-based surfactant. The cleaning liquids of the invention are capable of providing PCBs without such defects as short circuits, open circuits and lifted circuits caused by solder residue that is not completely removed therefrom using the earlier cleaning liquids. The invention is further capable of achieving evenly solder printed surfaces on PCBs and minimizing the causes incurring poor PCBs.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A method for washing metal masks using a cleaning liquid, comprising steps of:

washing the metal masks before a solder printing process on printed circuit boards;

washing the metal masks at least once during the solder printing process; and washing the metal masks after completing the last solder printing process, wherein the three washing steps are performed with said cleaning liquid consisting of from 1 to 5% by weight of a fluorine-based surfactant and from 95 to 99% by weight of isopropyl alcohol, the sum of the constituents being 100% by weight.

2. The method of claim 1, the washing steps being performed with said cleaning liquid consisting of 2% by weight of the fluorine-based surfactant and 98% by weight of isopropyl alcohol, the sum of the constituents being 100% by weight.

3. A method for washing metal masks using a cleaning liquid, comprising steps of:

washing the metal masks before a solder printing process on printed circuit boards;

washing the metal masks at least once during the solder printing process; and washing the metal masks after completing the last solder printing process, wherein the three washing steps are performed with said cleaning liquid consisting essentially of from 1 to 5% by weight of a fluorine-based surfactant and from 95 to 99% by weight of isopropyl alcohol, the sum of the constituents being 100% by weight.

4. The method of claim 3, the washing steps being performed with said cleaning liquid consisting essentially of 2% by weight of the fluorine-based surfactant and 98% by weight of isopropyl alcohol, the sum of the constituents being 100% by weight.

* * * * *